(12) United States Patent
Yang et al.

(10) Patent No.: US 10,026,784 B2
(45) Date of Patent: Jul. 17, 2018

(54) DISPLAY PANEL SUBPIXELS USING COMBINATION OF LAYERS OF EMISSIVE MATERIALS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Jiantao Liu, Beijing (CN); Feng Bai, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 83 days.

(21) Appl. No.: 15/035,756

(22) PCT Filed: Dec. 10, 2015

(86) PCT No.: PCT/CN2015/096955
§ 371 (c)(1),
(2) Date: May 11, 2016

(87) PCT Pub. No.: WO2016/188088
PCT Pub. Date: Dec. 1, 2016

(65) Prior Publication Data
US 2017/0104039 A1    Apr. 13, 2017

(30) Foreign Application Priority Data
May 27, 2015   (CN) .......................... 2015 1 0278089

(51) Int. Cl.
| | | |
|---|---|---|
| *H01L 29/20* | (2006.01) |
| *H01L 27/32* | (2006.01) |
| *H01L 51/56* | (2006.01) |
| *H01L 51/50* | (2006.01) |

(52) U.S. Cl.
CPC ........ *H01L 27/3216* (2013.01); *H01L 27/322* (2013.01); *H01L 51/5092* (2013.01); *H01L 51/56* (2013.01)

(58) Field of Classification Search
CPC .................................................. H01L 27/3216
(Continued)

(56) References Cited

U.S. PATENT DOCUMENTS

2005/0173700 A1    8/2005   Liao et al.
2013/0140533 A1*   6/2013   Lee ..................... H01L 51/5265
                                                                257/40
(Continued)

FOREIGN PATENT DOCUMENTS

CN    101083275 A    12/2007
CN    103050630 A     4/2013
(Continued)

OTHER PUBLICATIONS

International Search Report & Written Opinion dated Mar. 21, 2016 regarding PCT/CN2015/096955.
(Continued)

*Primary Examiner* — Ajay K Arora
(74) *Attorney, Agent, or Firm* — Intellectual Valley Law, P.C.

(57) ABSTRACT

The present application discloses a display panel comprising a light emitting region comprising a plurality of light emitting units. Each of the plurality of light emitting units comprising a first sub-pixel comprising a first emissive layer of a first light emitting material for emitting light of a first color; a second sub-pixel comprising a second emissive
(Continued)

layer of a second light emitting material for emitting light of a second color; and a third sub-pixel comprising a third emissive layer comprising the first light emitting material and the second light emitting material in vertical stack.

20 Claims, 2 Drawing Sheets

(58) Field of Classification Search
USPC .......................................................... 257/89
See application file for complete search history.

(56) References Cited

U.S. PATENT DOCUMENTS

2014/0080237 A1* 3/2014 Kim .................... H01L 51/0011
438/29

2015/0187858 A1* 7/2015 Wang .................. H01L 27/3216
257/40

FOREIGN PATENT DOCUMENTS

| CN | 103839960 A | 6/2014 |
| CN | 103943650 A | 7/2014 |
| CN | 104103672 A | 10/2014 |
| CN | 104882465 A | 9/2015 |

OTHER PUBLICATIONS

First Office Action in the Chinese Patent Application No. 201510278089.2, dated May 25, 2017; English translation attached.
The Second Office Action in the Chinese Patent Application No. 201510278089.2, dated Dec. 5, 2017; English translation attached.

* cited by examiner

DISPLAY PANEL SUBPIXELS USING COMBINATION OF LAYERS OF EMISSIVE MATERIALS

CROSS-REFERENCE TO RELATED APPLICATION

This application is a national stage application under 35 U.S.C. § 371 of International Application No. PCT/CN2015/096955 filed Dec. 10, 2015, which claims priority to Chinese Patent Application No. 201510278089.2, filed May 27, 2015, the contents of which are incorporated by reference in the entirety.

FIELD

The present invention relates to display technology, more particularly, to a display panel, a display device having the same, and a fabricating method thereof.

BACKGROUND

An organic light emitting display (OLED) device provides a high degree of color saturation and a wide viewing angle. In a conventional RGB OLED device, the fabrication of the sub-pixels typically involves complex processes, e.g., a vapor deposition using a fine metal mask (FMM). The use of FMM makes the fabricating process significantly more complicated, resulting in a high defect rate and high fabricating costs. In addition, light emitting efficiency and service life of sub-pixels for emitting different colors vary greatly due to the different properties among various light emitting materials used.

SUMMARY

In one aspect, the present invention provides a display panel comprising a light emitting region comprising a plurality of light emitting units. Each of the plurality of light emitting units comprising a first sub-pixel for emitting light of a first color comprising a first emissive layer of a first light emitting material; a second sub-pixel for emitting light of a second color comprising a second emissive layer of a second light emitting material; and a third sub-pixel comprising a third emissive layer comprising the first light emitting material and the second light emitting material in vertical stack.

Optionally, the display panel further comprises a first color filter for converting light from the third sub-pixel into a third color.

Optionally, the first color, the second color and the third color are three different colors selected from red, green and blue.

Optionally, the first light emitting material and the second light emitting material are selected from any two of a red light emitting material, a green light emitting material, and a blue light emitting material.

Optionally, the first light emitting material is the red light emitting material and the first sub-pixel is the red light emitting sub-pixel; the second light emitting material is the green light emitting material and the second sub-pixel is the green light emitting sub-pixel; and the third sub-pixel comprises a third emissive layer comprising the red light emitting material and the green light emitting material in vertical stack.

Optionally, the third sub-pixel comprises a third emissive layer comprising the red light emitting material over the green light emitting material in vertical stack.

Optionally, the third sub-pixel comprises a third emissive layer comprising the green light emitting material over the red light emitting material in vertical stack.

Optionally, the first color filter is a blue color filter.

Optionally, the display panel further comprises a second color filter above the first sub-pixel and a third color filter above the second sub-pixel.

Optionally, the first color filter is a blue color filter, the second color filter is a red color filter, and the third color filter is a green color filter.

Optionally, the display panel further comprises a base substrate, an anode, a hole injection layer, a hole transmission layer, an electron transmission layer, an electron injection layer, and a cathode.

Optionally, the anode, the hole injection layer, the hole transmission layer, the light emitting region, the electron transmission layer, the electron injection layer, and the cathode are sequentially on the base substrate along a direction away from the base substrate.

Optionally, the display panel further comprises a hole transmission modulating layer between the hole transmission layer and at least one of the first sub-pixel, the second sub-pixel, and the third sub-pixel.

Optionally, the display panel further comprises an optical extraction layer on a side of the cathode distal to the base substrate.

Optionally, the display panel further comprises an encapsulating substrate and a blue color filter above the third sub-pixel, wherein the blue color filter is on a side of the encapsulating substrate proximal to the cathode.

In another aspect, the present invention also provides a display device comprising the display panel described herein.

In another aspect, the present invention further provides a method of fabricating a display panel, comprising forming a first emissive layer of a first sub-pixel for emitting light of a first color and a first emissive sub-layer using a first light emitting material in a single process; forming a second emissive layer of a second sub-pixel for emitting light of a second color and a second emissive sub-layer using a second light emitting material in a single process; and forming a third emissive layer of a third sub-pixel comprising the first emissive sub-layer and the second emissive sub-layer in vertical stack.

Optionally, the method further comprises forming a first color filter for converting light from the third emissive layer into a third color.

Optionally, the first color, the second color and the third color are three different colors selected from red, green and blue.

Optionally, the first light emitting material and the second light emitting material are selected from any two of a red light emitting material, a green light emitting material, and a blue light emitting material.

Optionally, the first light emitting material is the red light emitting material and the first sub-pixel is the red light emitting sub-pixel, and the second light emitting material is the green light emitting material and the second sub-pixel is the green light emitting sub-pixel; the method comprising forming the first emissive sub-layer and the first emissive layer in a single process; and subsequently forming the second emissive sub-layer and the second emissive layer in a single process.

Optionally, the first light emitting material is the red light emitting material and the first sub-pixel is the red light emitting sub-pixel, and the second light emitting material is the green light emitting material and the second sub-pixel is the green light emitting sub-pixel; the method comprising forming the second emissive sub-layer and the second emissive layer in a single process; and subsequently forming the first emissive sub-layer and the first emissive layer in a single process.

Optionally, the first color filter is a blue color filter.

Optionally, the method further comprises forming a second color filter above the red light emitting sub-pixel; and forming a third color filter above the green light emitting sub-pixel.

Optionally, the first color filter is a blue color filter, the second color filter is a red color filter, and the third color filter is a green color filter.

Optionally, the method further comprises providing a base substrate; forming an anode, a hole injection layer, and a hole transmission layer on the base substrate along a direction away from the base substrate; forming the light emitting region; and forming an electron transmission layer, an electron injection layer, and a cathode on the light emitting region on the light emitting region along a direction away from the base substrate.

Optionally, prior to forming the light emitting region, the method further comprises forming a hole transmission modulating layer between the hole transmission layer and at least one of the first sub-pixel, the second sub-pixel, and the third sub-pixel.

BRIEF DESCRIPTION OF THE FIGURES

The following drawings are merely examples for illustrative purposes according to various disclosed embodiments and are not intended to limit the scope of the present invention.

DETAILED DESCRIPTION OF THE EMBODIMENTS

Figure 1:
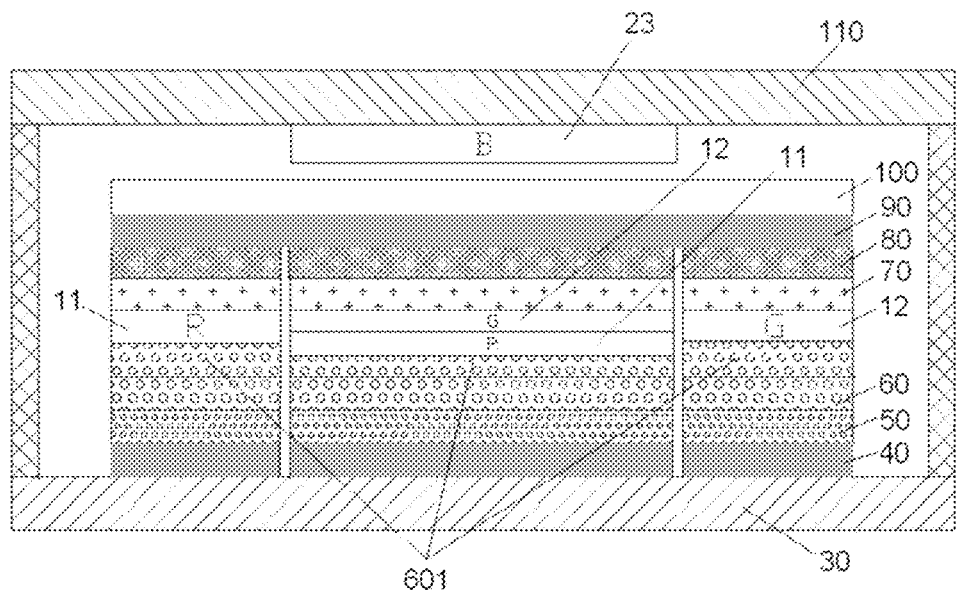
FIG. 1 is a diagram illustrating the structure of a display panel in some embodiments.

The disclosure will now describe more specifically with reference to the following embodiments. It is to be noted that the following descriptions of some embodiments are presented herein for purpose of illustration and description only. It is not intended to be exhaustive or to be limited to the precise form disclosed.

The present disclosure provides a display panel having a light emitting region comprising a plurality of light emitting units. The light emitting unit includes three sub-pixels. The first sub-pixel includes a first emissive layer having a first light emitting material for emitting light of a first color. The second sub-pixel includes a second emissive layer having a second light emitting material for emitting light of a second color. The third sub-pixel includes a third emissive layer having the first light emitting material and the second light emitting material in vertical stack. Optionally, the display panel further includes a color filter above the third sub-pixel for converting light from the third sub-pixel into a third color. Optionally, the display panel further includes a second color filter above the first sub-pixel and a third color filter above the second sub-pixel. Optionally, the first color, the second color, and the third color are three different colors selected from red, green, and blue. Optionally, the first color filter is a blue color filter. Optionally, the second color filter is a red color filter. Optionally, the third color filter is a green color filter.

In some embodiments, the first sub-pixel and the second sub-pixel can be selected from any two of a red light emitting sub-pixel, a green light emitting sub-pixel, and a blue light emitting sub-pixel. The first, the second, and the third sub-pixels have different peak emission wavelengths. The first sub-pixel has a first peak emission wavelength. The second sub-pixel has a second peak emission wavelength different from the first peak emission wavelength. The third sub-pixel has a third peak emission wavelength different from the first peak emission wavelength and the second peak emission wavelength. The first peak emission wavelength and the second peak emission wavelength can be selected from any two of a red color wavelength, a green color wavelength, and a blue color wavelength. In some embodiments, the first light emitting material and the second light emitting material are selected from any two of a red light emitting material, a green light emitting material, and a blue light emitting material.

For example, the first and the second sub-pixels can be a blue light emitting sub-pixel and a green light emitting sub-pixel, and the first and the second light emitting materials can be a blue light emitting material and a green light emitting material. Optionally, the first and the second sub-pixels can be a blue light emitting sub-pixel and a red light emitting sub-pixel, and the first and the second light emitting materials can be a blue light emitting material and a red light emitting material. Optionally, the first and the second sub-pixels can be a green light emitting sub-pixel and a red light emitting sub-pixel, and the first and the second light emitting materials can be a green light emitting material and a red light emitting material.

In a conventional OLED, a three-mask process is required for fabricating three sub-pixels of different colors. In some embodiments, the present disclosure provides a two-mask process for making three sub-pixels of different colors. For example, the first emissive layer and a first emissive sub-layer of the third emissive layer can be formed in a single process. The second emissive layer and a second emissive sub-layer of the third emissive layer can be formed in another single process. By doing so, the number of mask processes and the defect rate can be reduced, and the fabricating efficiency can be improved.

In some embodiments, the three sub-pixels can be made using only two light emitting materials instead of three light emitting materials. This is advantageous because the first and the second light emitting materials can be selected from two light emitting materials having a higher emitting efficiency and a longer service life, obviating the need for using a light emitting material having poorer properties. For example, the third sub-pixel can be made by vertically stacking the first and the second light emitting materials. The light emitted from the third sub-pixel is then filtered by a color filter to obtain a desired wavelength. By avoiding the light emitting material having poorer qualities, the light emitting efficiency and service life of the display device can be greatly improved.

The light emitting material can be any appropriate light emitting material such as a fluorescent material or a phosphorescent material. The first and second light emitting materials in the third sub-pixel can be stacked in any order, e.g., the first light emitting material can be vertically stacked over the second light emitting material, or the second light emitting material can be vertically stacked over the first light emitting material.

FIG. 1 is a diagram illustrating the structure of a display panel in some embodiments. Referring to FIG. 1, the first sub-pixel is the red light emitting sub-pixel and the first light emitting material is the red light emitting material 11, the second sub-pixel is the green light emitting sub-pixel and the second light emitting material is the green light emitting material 12. The third sub-pixel includes a third emissive layer having the red light emitting material 11 and the green light emitting material 12 in vertical stack.

As compared to red and green light emitting materials, a blue light emitting material has a relatively lower light emitting efficiency and a relatively shorter service life. In some embodiments, a third sub-pixel having the red light emitting material 11 and the green light emitting material 12 in vertical stack is used in lieu of a blue light emitting sub-pixel. A blue light filter is then utilized for converting the light emitted from the third sub-pixel into a blue light. In a single process, the first emissive layer and a first emissive sub-layer of the third emissive layer can be formed using the red light emitting material 11. In a single process, the second emissive layer and a second emissive sub-layer of the third emissive layer can be formed using the green light emitting material 12. As discussed above, the light emitting efficiency and service life of the display device can be significantly improved, fabricating process greatly simplified, and the defect rate and costs much reduced.

The red light emitting material 11 can be any appropriate material that emits a light having a red color wavelength such as a red fluorescent material or a red phosphorescent material. The green light emitting material 12 can be any appropriate material that emits a light having a green color wavelength such as a green fluorescent material or a green phosphorescent material.

Figure 2:
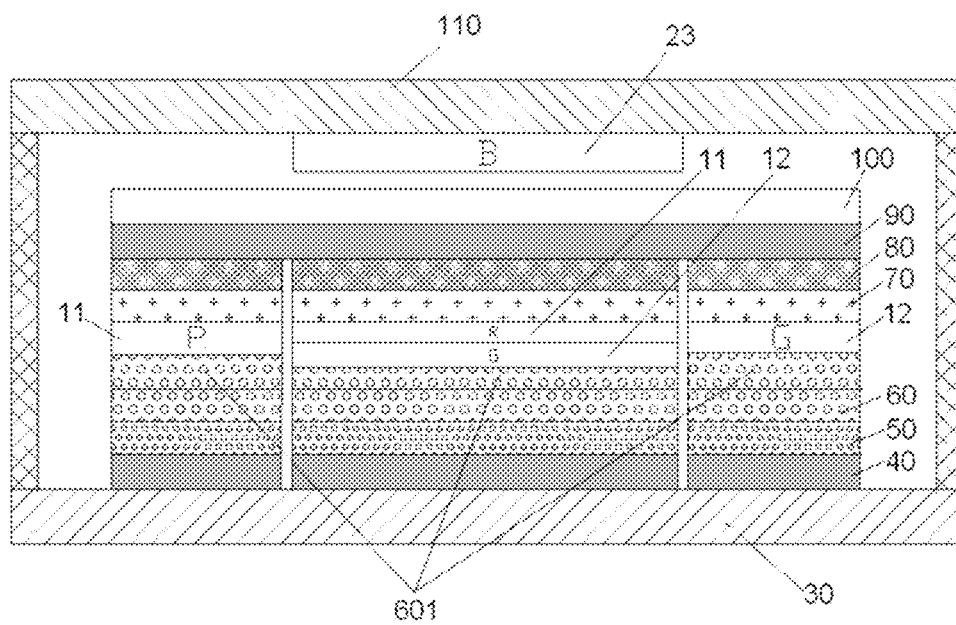
FIG. 2 is a diagram illustrating the structure of a display panel in some embodiments.

The red light emitting material 11 and the green light emitting material 12 in the third sub-pixel can be stacked in any order, e.g., the red light emitting material 11 can be vertically stacked over the green light emitting material 12, or the green light emitting material 12 can be vertically stacked over the red light emitting material 11 (FIG. 2).

As shown in FIG. 2, the display panel in the embodiment includes a blue color filter 23 above the third sub-pixel. The light emitted from the third sub-pixel is a combination of a red light and a green light, having a third peak emission wavelength. The light emitted from the third sub-pixel is filtered by a blue color filter to generate a blue light having a desired peak wavelength of blue color. The first and the second sub-pixels, in combination with the third sub-pixel with the blue color filter, form the R, G, B sub-pixels of the display panel.

Optionally, the display panel in the embodiment further includes a red color filter 21 above the first sub-pixel and/or a green color filter 22 above the second sub-pixel. The color filters may be made of a material having a longer service life than the light emitting materials, e.g., a resin material. By having color filters above the sub-pixels, the service life and the display quality of the display panel can be improved.

Figure 4:
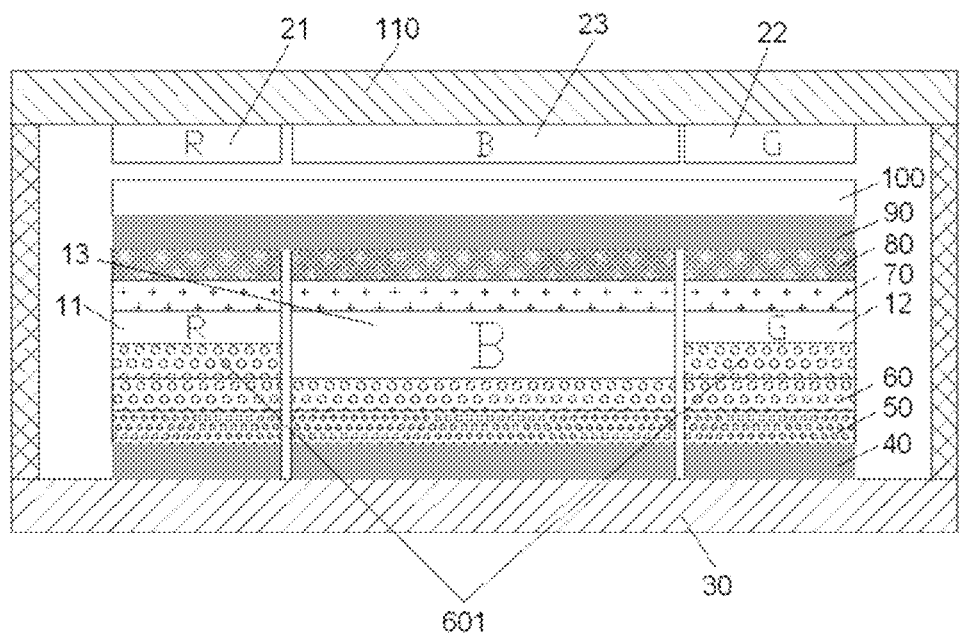
FIG. 4 is a diagram illustrating the structure of a display panel in some embodiments.

Accordingly, in another aspect, the present disclosure provides a display panel having a color filter above at least one sub-pixels wherein the color filter has a longer service life than the light emitting material used in the at least one sub-pixels. The color filter having a longer service life can be used in any type of light emitting unit including the conventional RGB light emitting unit having three different light emitting materials. For example, a color filter having a longer service life can be disposed above a red light emitting sub-pixel, a green light emitting sub-pixel, a blue light emitting sub-pixel, or a sub-pixel having vertically stacked two or more light emitting materials. As shown in FIG. 4, the display panel in the embodiment includes a red light emitting sub-pixel having a red light emitting material 11, a green light emitting sub-pixel having a green light emitting material 12, and a blue light emitting sub-pixel having a blue light emitting material 13. The blue light emitting material 13 can be any appropriate material that emits a light having a blue color wavelength such as a blue fluorescent material or a blue phosphorescent material. The display panel in the embodiment further includes a red color filter 21 above the red light emitting sub-pixel having the red light emitting material 11, a green color filter 22 above the green light emitting sub-pixel having the green light emitting material 12, and a blue color filter 23 above the blue light emitting sub-pixel having the blue light emitting material 13. The light emitting efficiency and service life limited by the properties of light emitting material can be greatly improved by having a combination of a longer service life color filter and the sub-pixels.

Figure 3:
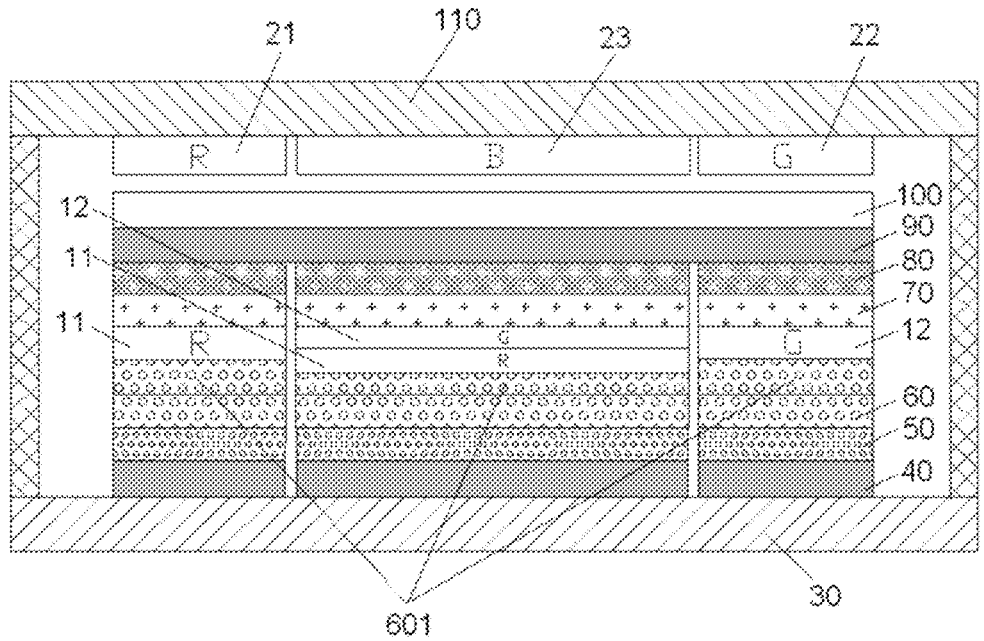
FIG. 3 is a diagram illustrating the structure of a display panel in some embodiments.

Referring to FIGS. 1-3, the sub-pixels in the embodiments can be arranged in any order such as R/W/G, R/G/W, W/R/G, W/G/R, G/W/R, or G/R/W, wherein W is the third sub-pixel.

In some embodiments, each of the color filters has a shape corresponding to the shape of the pairing sub-pixel, and is at a position corresponding to the position of the pairing sub-pixel. For example, the blue color filter can have a shape matching the shape of the third sub-pixel, and is at a position corresponding to the third sub-pixel so that the light emitted from the third sub-pixel passes through the blue color filter.

In some embodiments, the display panel further includes a base substrate 30, an anode 40, a hole injection layer 50, a hole transmission layer 60, an electron transmission layer 70, an electron injection layer 80, and a cathode 90. The anode 40, the hole injection layer 50, the hole transmission layer 60, the light emitting region including three sub-pixels, the electron transmission layer 70, the electron injection layer 80, and the cathode 90 are arranged on the base substrate 30 along a direction away from the base substrate 30.

In some embodiments, the display panel further includes a hole transmission modulating layer 601 between the hole transmission layer 60 and at least one of the first sub-pixel (e.g., the red light emitting sub-pixel), the second sub-pixel (e.g., the green light emitting sub-pixel), and the third sub-pixel (e.g., one having vertically stacked red light emitting material 11 and green light emitting material 12). The hole transmission modulating layer 601 can be specifically designed for each individual sub-pixel. The hole transmission modulating layer 601 can adjust the carrier equilibrium. A lower light emitting efficiency due to micro-cavity effect can be improved by having the hole transmission modulating layer 601.

The hole transmission modulating layer 601 may be made of a same material as the hole transmission layer 60. Alternatively, for achieving an optimal light emitting efficiency, the hole transmission modulating layer 601 may be made of a doped material based on the properties of each individual light emitting material.

In some embodiments, the display panel further includes an optical extraction layer 100 on a side of the cathode 90 distal to the base substrate, maximizing light extraction from the light emission region.

In some embodiments, the display panel further includes an encapsulating glass 110 above the third sub-pixel. Optionally, the display panel includes an encapsulating glass 110 and a blue color filter 23 above the third sub-pixel. Optionally, the blue color filter 23 is on a side of the encapsulating glass 110 proximal to the cathode 90.

In another aspect, the present disclosure also provides a method of fabricating a display panel. In some embodiments, the method includes forming a light emitting region having three sub-pixels. The first sub-pixel includes a first emissive layer having a first light emitting material. The second sub-pixel includes a second emissive layer having a second light emitting material. The third sub-pixel includes a third emissive layer having the first light emitting material and the second light emitting material in vertical stack.

In some embodiments, the method includes forming the first emissive layer of a first sub-pixel for emitting light of a first color and a first emissive sub-layer using the first light emitting material in a single process; forming the second emissive layer of a second sub-pixel for emitting light of a second color and a second emissive sub-layer using the second light emitting material in a single process; and forming the third emissive layer of a third sub-pixel having the first emissive sub-layer and the second emissive sub-layer in vertical stack.

In some embodiments, the method further includes forming a first color filter for converting light from the third emissive layer into a third color. Optionally, the method further includes forming a second color filter above the first emissive layer. Optionally, the method further includes forming a third color filter above the second emissive layer. Optionally, the first color filter is a blue color filter. Optionally, the second color filter is a red color filter. Optionally, the third color filter is a green color filter.

Optionally, the first color, the second color and the third color are three different colors selected from red, green and blue.

In some embodiments, the first sub-pixel and the second sub-pixel are selected from any two of a red light emitting sub-pixel, a green light emitting sub-pixel, and a blue light emitting sub-pixel. The first light emitting material and the second light emitting material are selected from any two of a red light emitting material, a green light emitting material, and a blue light emitting material.

As discussed above, in a conventional OLED, a three-mask process is required for fabricating three sub-pixels of different colors. In some embodiments, the present disclosure provides a two-mask process for making three sub-pixels of different colors. For example, the first emissive layer and a first emissive sub-layer of the third emissive layer can be formed in a single process. The second emissive layer and a second emissive sub-layer of the third emissive layer can be formed in another single process. By doing so, the number of mask processes and the defect rate can be reduced, and the fabricating efficiency can be improved.

In some embodiments, the three sub-pixels can be made using only two light emitting materials instead of three light emitting materials. This is advantageous because the first and the second light emitting materials can be selected from two light emitting materials having a higher emitting efficiency and a longer service life, obviating the need for using a light emitting material having poorer properties. For example, the third sub-pixel can be made by vertically stacking the first and the second light emitting materials. The light emitted from the third sub-pixel is then filtered by a color filter to obtain a desired wavelength. By avoiding the light emitting material having poorer qualities, the light emitting efficiency and service life of the display device can be greatly improved.

In some embodiments, the step of forming the third emissive layer includes forming a first emissive sub-layer having the first light emitting material and forming a second emissive sub-layer having the second light emitting material over the first emissive sub-layer. Optionally, the first emissive sub-layer and the first emissive layer are formed in a single process, and the second emissive sub-layer and the second emissive layer are formed in a single process.

In some embodiments, the first light emitting material is a red light emitting material and the first sub-pixel is a red light emitting sub-pixel, the second light emitting material is a green light emitting material and the second sub-pixel is a green light emitting sub-pixel, and the third sub-pixel includes a third emissive layer having vertically stacked red light emitting material and green light emitting material.

In some embodiments, the method includes forming the first emissive layer having the red light emitting material, and forming the first sub-pixel; forming the second emissive layer having the green light emitting material, and forming the second sub-pixel; and forming the third emissive layer by vertically stacking the red light emitting material and the green light emitting material, and forming the third sub-pixel.

As compared to a blue light emitting material, red and green light emitting materials have relatively a higher light emitting efficiency and a relatively longer service life. In some embodiments, a third sub-pixel having the red light emitting material and the green light emitting material in vertical stack is used for generating a combination of a red light and a green light. A blue light filter is then utilized for converting the light emitted from the third sub-pixel into a blue light. As discussed above, the light emitting efficiency and service life of the display device can be significantly improved, fabricating process greatly simplified, and the defect rate and costs much reduced.

The red light emitting material and the green light emitting material in the third sub-pixel can be stacked in any order, e.g., the red light emitting material can be vertically stacked over the green light emitting material, or the green light emitting material can be vertically stacked over the red light emitting material. For example, the first emissive sub-layer of the third emissive layer can be first formed following by forming the second emissive sub-layer of the third emissive layer. Alternatively, the second emissive sub-layer of the third emissive layer can be first formed following by forming the first emissive sub-layer of the third emissive layer.

In some embodiments, the first light emitting material is the red light emitting material and the first sub-pixel is the red light emitting sub-pixel, and the second light emitting material is the green light emitting material and the second sub-pixel is the green light emitting sub-pixel. Optionally, the method includes forming the first emissive sub-layer and the first emissive layer in a single process; and subsequently forming the second emissive sub-layer and the second emissive layer in a single process. Optionally, the method includes forming the second emissive sub-layer and the second emissive layer in a single process; and subsequently forming the first emissive sub-layer and the first emissive layer in a single process.

The masks required for forming the first emissive sub-layer and the first emissive layer in a single process and forming the second emissive sub-layer and the second emissive layer in a single process can be conveniently modified from the masks for forming the first emissive layer (e.g., the red light emissive layer) and the second emissive layer (e.g., the green light emissive layer). One mask process can be eliminated by adopting the present method, greatly enhancing fabricating efficiency and decreasing defect rate.

In some embodiments, the method further includes forming a blue color filter above the third sub-pixel. The light emitted from the third sub-pixel is a combination of a red light and a green light, having a third peak emission wavelength. The light emitted from the third sub-pixel is filtered by a blue color filter to generate a blue light having a desired peak wavelength of blue color. The first and the second sub-pixels, in combination with the third sub-pixel with the blue color filter, form the R, G, B sub-pixels of the display panel.

In some embodiments, the method further includes forming a red color filter above the red light emitting sub-pixel; and/or forming a green color filter above the green light emitting sub-pixel. The color filters may be made of a material having a longer service life than the light emitting materials, e.g., a resin material. By having color filters above the sub-pixels, the service life and the display quality of the display panel can be improved.

In some embodiments, the method further includes providing a base substrate; forming an anode, a hole injection layer, and a hole transmission layer on the base substrate along a direction away from the base substrate; forming the light emitting region; and forming an electron transmission layer, an electron injection layer, and a cathode on the light emitting region on the light emitting region along a direction away from the base substrate.

In some embodiments, the method further includes prior to forming the light emitting region, forming a hole transmission modulating layer between the hole transmission layer and at least one of the first emissive layer, the second emissive layer, and the third emissive layer. Optionally, the hole transmission modulating layer can be specifically designed for each individual sub-pixel. The hole transmission modulating layer can adjust the carrier equilibrium. A lower light emitting efficiency due to micro-cavity effect can be improved by having the hole transmission modulating layer.

In another aspect, the present disclosure also provides a display device having the display panel described herein or manufactured by a method described herein. As compared to the conventional display device, the display device described herein has a higher light emitting efficiency, a longer service life, a higher fabricating efficiency, and a lower defect rate.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel having a plurality of pixels, each of which comprising a first sub-pixel for emitting light of a first color, a second sub-pixel for emitting light of a second color, and a third sub-pixel for emitting light of a color different from the first color and the second color, the display panel comprising:
   a base substrate;
   a first electrode layer on the base substrate;
   a first emissive layer in the first sub-pixel, the first emissive layer consisting essentially of a first light emitting material;
   a second emissive layer in the second sub-pixel, the second emissive layer consisting essentially of a second light emitting material;
   a third emissive layer in the third sub-pixel, the third emissive layer consisting essentially of a first emissive sub-layer of the first light emitting material and a second emissive sub-layer of the second light emitting material in vertical stack;
   a second electrode layer on a side of the first emissive layer, the second emissive layer, and the third emissive layer distal to the first electrode layer;
   an optical extraction layer on a side of the second electrode layer distal to the base substrate;
   an encapsulating substrate on a side of the optical extraction layer distal to the base substrate; and
   a first color filter for converting light from the third sub-pixel into a third color on a side of the encapsulating substrate proximal to the second electrode layer.

2. The display panel of claim 1,
   wherein the first emissive layer and the first emissive sub-layer are in a same layer and consist essentially of a same material; and
   the second emissive layer and the second emissive sub-layer are in a same layer and consist essentially of a same material.

3. The display panel of claim 1, wherein the first color, the second color and the third color are three different colors selected from red, green and blue.

4. The display panel of claim 1, wherein the first light emitting material and the second light emitting material are selected from any two of a red light emitting material, a green light emitting material, and a blue light emitting material.

5. The display panel of claim 4, wherein
the first light emitting material is the red light emitting material and the first sub-pixel is the red light emitting sub-pixel;
the second light emitting material is the green light emitting material and the second sub-pixel is the green light emitting sub-pixel; and
the third emissive layer consists essentially of the red light emitting material and the green light emitting material in vertical stack.

6. The display panel of claim 5, wherein the third emissive layer consists essentially of the red light emitting material on a side of the green light emitting material distal to the base substrate.

7. The display panel of claim 5, wherein the third emissive layer consists essentially of the green light emitting material on a side of the red light emitting material distal to the base substrate.

8. The display panel of claim 1, wherein the first color filter is a blue color filter.

9. The display panel of claim 1, further comprising a second color filter above the first sub-pixel and a third color filter above the second sub-pixel.

10. The display panel of claim 9, wherein the first color filter is a blue color filter, the second color filter is a red color filter, and the third color filter is a green color filter.

11. The display panel of claim 1, further comprising a hole injection layer, a hole transmission layer, an electron transmission layer, and an electron injection layer;
wherein the first electrode layer, the hole injection layer, the hole transmission layer, the light emitting region, the electron transmission layer, the electron injection layer, and the second electrode layer are sequentially on the base substrate along a direction away from the base substrate.

12. A display panel having a plurality of pixels, each of which comprising a first sub-pixel for emitting light of a first color, a second sub-pixel for emitting light of a second color, and a third sub-pixel for emitting light of a color different from the first color and the second color, the display panel comprising:
a base substrate;
a first electrode layer on the base substrate;
a first emissive layer in the first sub-pixel, the first emissive layer comprising a first light emitting material;
a second emissive layer in the second sub-pixel, the second emissive layer comprising a second light emitting material;
a third emissive layer in the third sub-pixel, comprising a first emissive sub-layer of the first light emitting material and a second emissive sub-layer of the second light emitting material in vertical stack;
a second electrode layer on a side of the first emissive layer, the second emissive layer, and the third emissive layer distal to the first electrode layer;
a hole transmission layer between the first electrode layer and at least one of the first emissive layer, the second emissive layer, and the third emissive layer; and
a hole transmission modulating layer between the hole transmission layer and at least one of the first emissive layer, the second emissive layer, and the third emissive layer.

13. A display apparatus comprising the display panel of claim 1.

14. A method of fabricating a display panel having a plurality of pixels, each of which comprising a first sub-pixel for emitting light of a first color, a second sub-pixel for emitting light of a second color, and a third sub-pixel for emitting light of a color different from the first color and the second color, the method comprising:
forming a first electrode layer on a base substrate;
forming a first emissive layer in the first sub-pixel, the first emissive layer formed to consist essentially of a first light emitting material;
forming a second emissive layer in the second sub-pixel, the second emissive layer formed to consist essentially of a second light emitting material;
forming a third emissive layer in the third sub-pixel, the third emissive layer formed to consist essentially of a first emissive sub-layer of the first light emitting material and a second emissive sub-layer of the second light emitting material in vertical stack;
forming a second electrode layer on a side of the first emissive layer, the second emissive layer, and the third emissive layer distal to the first electrode layer;
forming an optical extraction layer on a side of the second electrode layer distal to the base substrate;
forming an encapsulating substrate on a side of the optical extraction layer distal to the base substrate; and
forming a first color filter on a side of the encapsulating substrate proximal to the second electrode layer for converting light from the third sub-pixel into a third color.

15. The method of claim 14, wherein the first emissive layer and the first emissive sub-layer are formed in a single patterning process using a same material and a same mask plate; and
the second emissive layer and the second emissive sub-layer are formed in a single patterning process using a same material and a same mask plate.

16. The method of claim 14, wherein the first color, the second color and the third color are three different colors selected from red, green and blue.

17. The method of claim 14, wherein the first light emitting material and the second light emitting material are selected from any two of a red light emitting material, a green light emitting material, and a blue light emitting material.

18. The method of claim 15, wherein the first light emitting material is a red light emitting material and the first sub-pixel is a red light emitting sub-pixel, and the second light emitting material is a green light emitting material and the second sub-pixel is a green light emitting sub-pixel; and
the first emissive sub-layer and the first emissive layer are formed prior to the second emissive sub-layer and the second emissive layer.

19. The method of claim 14, wherein the first color filter is a blue color filter.

20. The display panel of claim 12, wherein the hole transmission modulating layer comprises a dopant; and
dopants of the hole transmission modulating layer in at least two different sub-pixels selected from the first sub-pixel, the second sub-pixel, and the third sub-pixel are different from each other.

* * * * *